US009361064B2

(12) United States Patent  (10) Patent No.: US 9,361,064 B2
Degani et al.  (45) Date of Patent: Jun. 7, 2016

(54) METHODS AND SYSTEMS TO COMPENSATE FOR NON-LINEARITY OF A STOCHASTIC SYSTEM

(71) Applicant: INTEL CORPORATION, Santa Clara, CA (US)

(72) Inventors: Ofir Degani, Haifa (IL); Ashoke Ravi, Hillsboro, OR (US); Hasnain Lakdawala, Portland, OR (US)

(73) Assignee: Intel Corporation, Santa Clara, CA (US)

(*) Notice: Subject to any disclaimer, the term of this patent is extended or adjusted under 35 U.S.C. 154(b) by 273 days.

(21) Appl. No.: 14/022,683

(22) Filed: Sep. 10, 2013

(65) Prior Publication Data

US 2015/0074156 A1  Mar. 12, 2015

(51) Int. Cl.
*H03M 1/10* (2006.01)
*G06F 5/00* (2006.01)
*G04F 10/00* (2006.01)
*H03L 7/085* (2006.01)

(52) U.S. Cl.
CPC ............... *G06F 5/00* (2013.01); *G04F 10/005* (2013.01); *H03L 7/085* (2013.01); *H03M 1/1014* (2013.01); *H03M 1/1033* (2013.01); *H03L 2207/50* (2013.01)

(58) Field of Classification Search
CPC .... H03M 1/1033; H03M 1/1014; H03L 7/00; G04F 10/005
USPC .................................................. 341/120, 155
See application file for complete search history.

(56) References Cited

U.S. PATENT DOCUMENTS

| 6,658,368 | B2* | 12/2003 | Wagner et al. ................ 702/180 |
| 7,184,908 | B2* | 2/2007 | Mori ............................... 702/89 |
| 7,460,045 | B1* | 12/2008 | Cartina ......................... 341/120 |
| 8,773,182 | B1 | 7/2014 | Degani et al. |
| 8,803,716 | B1* | 8/2014 | Munnan et al. ............... 341/120 |
| 2014/0333358 | A1 | 11/2014 | Kim et al. |

OTHER PUBLICATIONS

Dudek, et al., "A high-resolution CMOS time-to-digital converter utilizing a Vernier delay line", IEEE J. Solid-State Circuits, vol. 35, Feb. 2000, pp. 240-247.
Gutnik, et al., "On-chip Picosecond Time Measurement", Digest of Technical Papers, 2000 Symposium on VLSI circuits, 2000, pp. 52-53.
(Continued)

*Primary Examiner* — Brian Young
(74) *Attorney, Agent, or Firm* — Garrett IP, LLC

(57) ABSTRACT

Determination of digital compensation to compensate for non-linearity of stochastic system configured to sample a phase difference, based on statistical analysis of calibration data generated by the stochastic system in response to a linear phase ramp. The stochastic system may include a set of stochastic sampler circuits to sample a phase difference at periodic events, and calibration data may include a digital value of set of stochastic samples for each of multiple events. The calibration data may include sequences of the digital values in which the digital values increment over a range of the stochastic system (i.e., between saturation states of the stochastic system). Statistical analysis may include histogram analysis to estimate the probability distribution of the calibration data. The stochastic system may be configured as part of a time-to-digital converter, which may be configured within a feedback loop of a digitally controllable phase lock loop.

24 Claims, 12 Drawing Sheets

(56) References Cited

OTHER PUBLICATIONS

Wikipedia, "Error Function", From Wikipedia, the free encyclopedia, retrieved on Apr. 8, 2013, 12 pages.

Wikipedia, "Quantile Function", From Wikipedia, the free encyclopedia, retrieved on Apr. 8, 2013, 5 pages.

Wikipedia, "Time-to-digital Converter", From Wikipedia, the free encyclopedia, retrieved on Apr. 8, 2013, 11 pages.

* cited by examiner

METHODS AND SYSTEMS TO COMPENSATE FOR NON-LINEARITY OF A STOCHASTIC SYSTEM

TECHNICAL FIELD

Features disclosed herein generally relate to determination of digital compensation to compensate for non-linearity of a stochastic system, time-to-digital converters (TDCs), phase/frequency control, and phase lock loops (PLLs).

BACKGROUND

Evolving standards for wireless data communication increase demands with respect to error vector magnitude (EVM) and spectral purity. This may lead to stricter requirements on local oscillator (LO) integrated phase noise and spurs.

Fractional-N digital phase lock loops (DPLLs) are increasingly being used for local oscillator (LO) generation. This may be attributable to:

lower area and power consumption relative to analog fractional-N PLLs;

ease of porting and scalability amongst process generations;

process, voltage, and temperature (PVT) insensitive loop dynamics; and/or programmability/re-configurability of loop performance.

A DPLL may include a time-to-digital converter (TDC) to measure and digitally encode an instantaneous phase of a PLL clock relative to a reference clock. Non-linearity and/or insufficient resolution of a TDC may result in spurs and impact spectral purity. Conventional techniques to reduce non-linearity and/or increase resolution may increase area and/or power consumption.

BRIEF DESCRIPTION OF THE DRAWINGS

For illustrative purposes, one or more features may be presented and/or described herein by way of example and/or with reference to one or more drawing figured listed below. Methods and systems disclosed herein are not, however, limited to such examples or illustrations.

Figure 1:
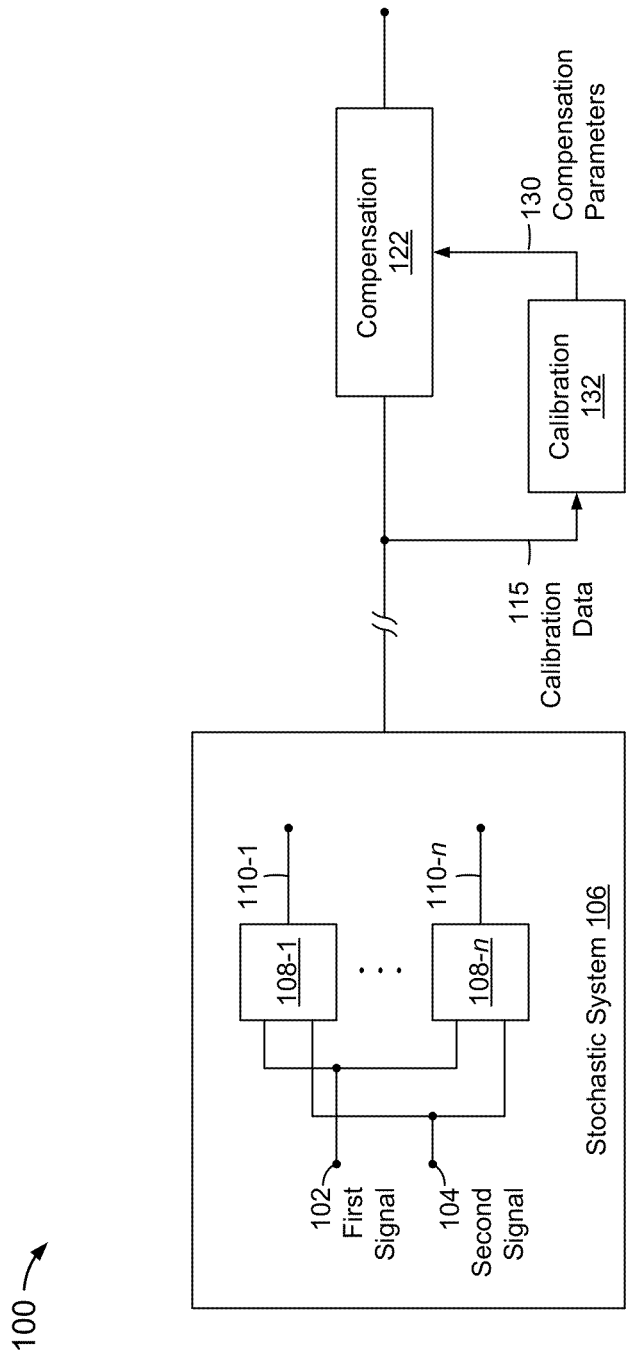
FIG. 1 is a block diagram of a stochastic system that includes a set of stochastic circuits to sample a signal or a phase difference between signals or clocks.

In the drawings, the leftmost digit(s) of a reference number identifies the drawing in which the reference number first appears.

DESCRIPTION

FIG. 1 is a block diagram of a stochastic system 106 having a set of stochastic devices or circuits 108-1 through 108-$n$ to sample a signal and output a corresponding set of stochastic samples, 110-1 through 110-$n$. Stochastic samples 100 may also be referred to herein as captured states, stochastic data, and/or outputs 110.

Stochastic circuits 108 may be configured to stochastically sample at events, such as transitions of a clock (i.e., rising and/or falling edge).

Stochastic circuits 108 may be configured to stochastically sample a phase difference between a first signal 102 and a second signal 104. For example, one of signals 102 and 104 may be applied to clock ports of circuits 108, and the other one of signals 102 and 104 may be applied to data ports of circuits 108.

Stochastic data 110 may provide a relatively precise indication of a phase difference between signals 102 and 104 as the phase differences approaches and/or transitions through 0° or 180°, such as described in one or more examples below.

In a stochastic system or process, a subsequent state depends on a combination of predictable and random features or characteristics. The subsequent state is indeterminable prior to the subsequent state due to the random characteristics. Stochastic systems and processes may be analyzed and/or modeled based on statistical probabilities.

In FIG. 1, circuits 108 are stochastic in that, when circuits 108 are clocked simultaneously, the time at which each circuit 108 captures a sample varies amongst circuits 108 due to random features or characteristics of the circuits, such as random process variations. If circuits 108 are simultaneously clocked near a transition of the sampled signal, a faster one of the circuits may capture a pre-transition state of the signal while a slower one of circuits 108 may capture a post-transition state of the signal. An example is provided below with reference to FIG. 3.

A transfer function of stochastic system 106 may be expressed as the probability distribution of the underlying distribution of response times or set-up times of stochastic circuits 108. The probability distribution may be described or expressed with, for example and without limitation, the quantile function, the quantile density function, the cumulative distribution function (CDF), the probability density function (PDF), and/or the characteristic function. The quantile function may also be referred to as the inverse cumulative distribution function. The PDF may also be referred to as the probability mass function.

The quantile function (of a probability distribution of a random variable) specifies a maximum value of the random variable for a given probability.

The cumulative distribution function (CDF) provides a probability for which a random variable with a given probability distribution will be found at a value less than or equal to a specified value. In the case of a continuous distribution (e.g., a phase difference ramp), CDF provides the area under the probability density function from minus infinity to the specified value.

The quantile function, Q, of a probability distribution is the inverse of its cumulative distribution function F.

The quantile density function is the derivative of the quantile function, and the reciprocal of the pdf composed with the quantile function.

For a Gaussian random distribution, an ideal or theoretical (e.g., linear) transfer function of stochastic system 106 follows the Gauss error function ("the error function"). In practice, distribution may deviate from the error function due to the finite number of circuits 108. The deviation from the error function is indicative of non-linearity of the transfer function, which may impact integral non-linearity (INL) of system 106.

In FIG. 1, stochastic system 106 is illustrated as part of a system 100 that further includes a compensation module 122 to compensate for non-linearity of stochastic system 106. System 100 may further include a calibration module 132 to determine calibration parameters 130 for compensation module 122 based on calibration data 115.

In an embodiment, calibration module 132 is configured as a manufacturing and/or test tool, such as to determine compensation parameters 130 for each of multiple stochastic systems 106. In another embodiment, compensation module 122 and calibration module 132 are on a same integrated circuit (IC) device, such as an IC die, an IC chip, and/or IC chipset. Calibration module 132 may be configured to determine compensation parameters 130 dynamically, such as to compensate for changes or variation due to age and/or environmental conditions (e.g., changes in temperature and/or operating voltage).

Calibration module 132 may be configured to determine compensation parameters 130 based on statistical and/or stochastic analyses, examples of which are provided further below.

System 100 and/or portions thereof, may be configured or implemented as described in one or more examples below. System 100 is not, however, limited to the examples below.

Figure 2:
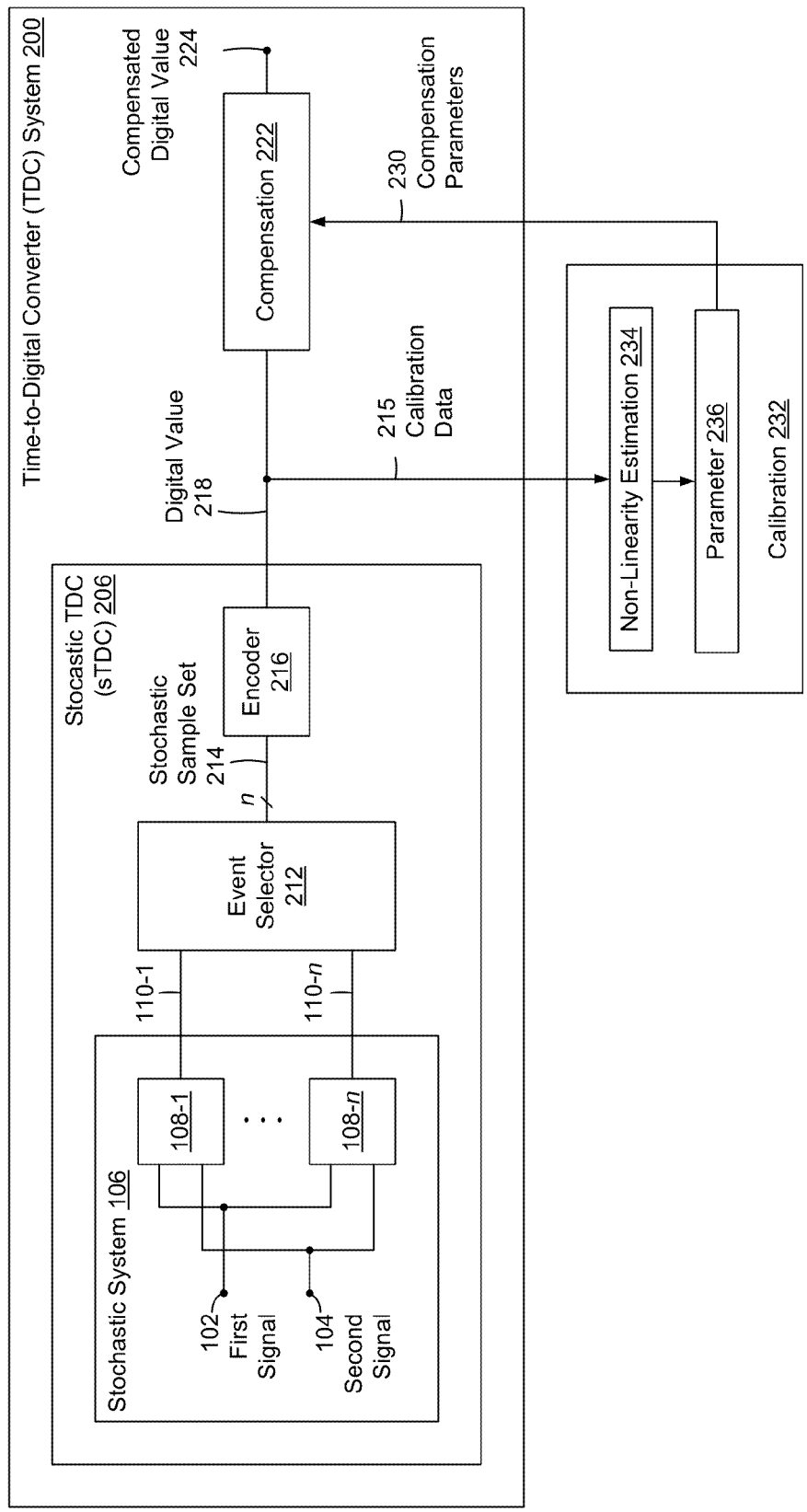
FIG. 2 is a block diagram of a time-to-digital converter (TDC) system in which the stochastic system of FIG. 1 configured as part of a stochastic TDC (sTDC) 206 to sample a phase difference between first and second clocks.

FIG. 2 is a block diagram of a time-to-digital converter system 200, in which stochastic system 106 is configured as part of a stochastic TDC (sTDC) 206, to stochastically sample a phase difference between first and second signals 102 and 104 at periodic events, such as described above with respect to FIG. 1.

sTDC 206 further includes digital encoder 216 to encode a set of stochastic samples for each of one or more events as a corresponding digital value 218.

sTDC 206 may include an event selector 212 to select a subset of the events based on one or more criteria. A set of stochastic samples 110 for a selected event may be provided to encoder 216 as a set of selected stochastic samples 214. Other sets of stochastic samples 110 may be discarded.

Selector 212 may be configured to select events that occur within a transition window in which the phase difference between signals 102 and 104 transitions through 0° or 180°, such as described below with reference to FIG. 3 and/or FIG. 4.

Figure 3:
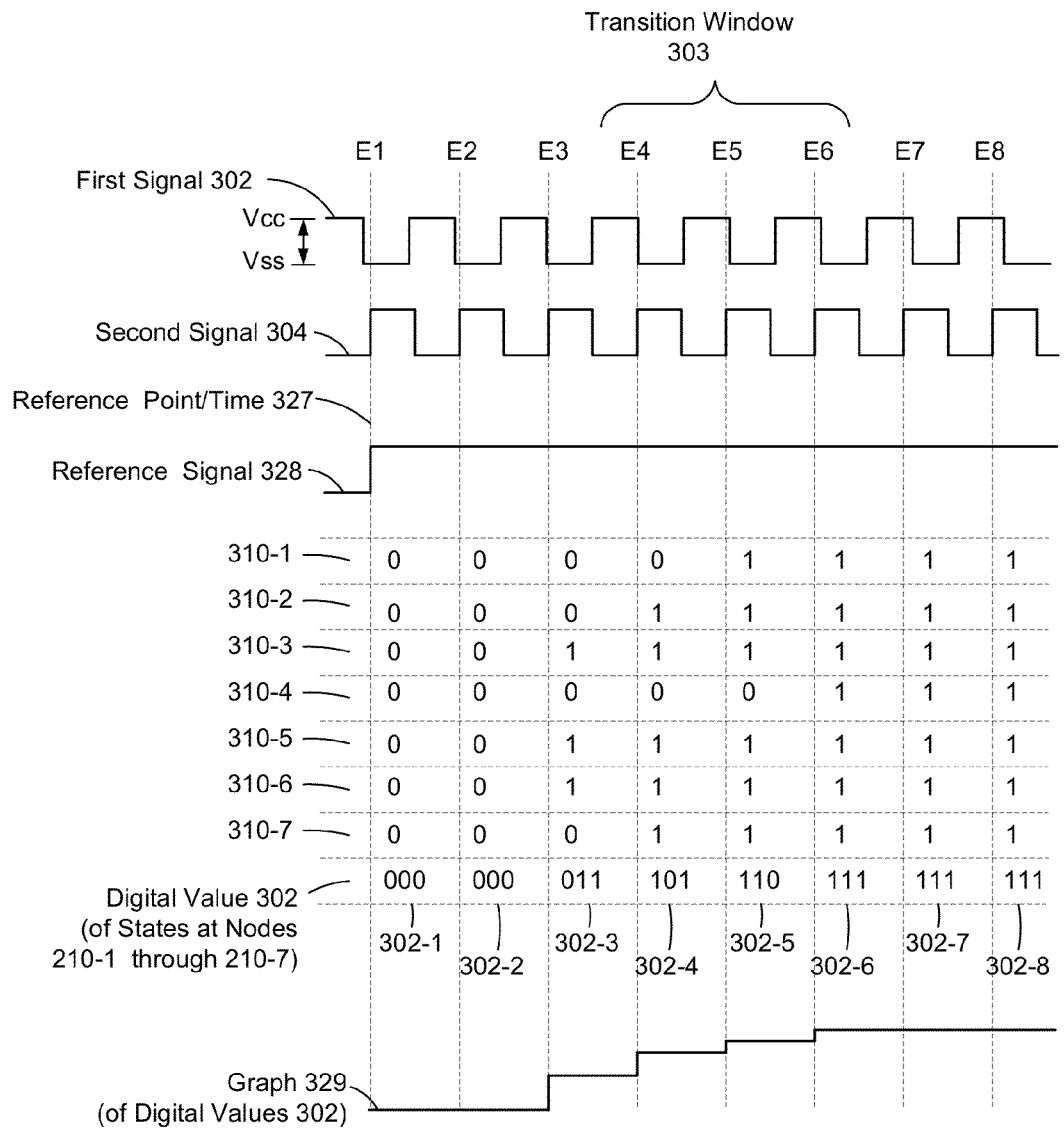
FIG. 3 depicts timing diagrams for the system of FIG. 2.

FIG. 3 depicts timing diagrams of first and second clocks 302 and 304. FIG. 3 is described below for an example in which a set of stochastic circuits is configured to sample or capture states of first clock 302 at periodic events, including events E1 through E8. For each of E1 through E8, a set of n samples (310-1 through 310-$n$) is captured at each of E1 through E8. Sample sets 310 may correspond to stochastic data 110 in FIG. 1 or FIG. 2.

The following discussion refers to logic states or values of 0 and 1. In an embodiment, logic 1 corresponds to an operating voltage, denoted Vcc, and logic 0 corresponds to a reference voltage, such as ground, denoted Vss. In another embodiment, logic 1 corresponds to the reference voltage and logic 0 corresponds to the operating voltage.

In the example of FIG. 3, n=7. Methods and systems disclosed herein are not, however, limited to these examples.

Events E1 through E8 may correspond to transitions (i.e., rising or falling edges) of first clock 302 or second clock 304. In other words, first clock 302 may be applied to data ports of the stochastic circuits, and second clock 304 may be applied to clock ports, or vice versa. In the example of FIG. 3, events E1 through E8 correspond to rising edges of second clock 304 (i.e., first clock 302 applied to data ports, second clock 304 applied to clock ports).

Where events E1 through E8 occur at a frequency of first clock 302 or second clock 304, each sample set 310 represents the phase difference between clocks 302 and 304 at the corresponding event.

Figure 4:
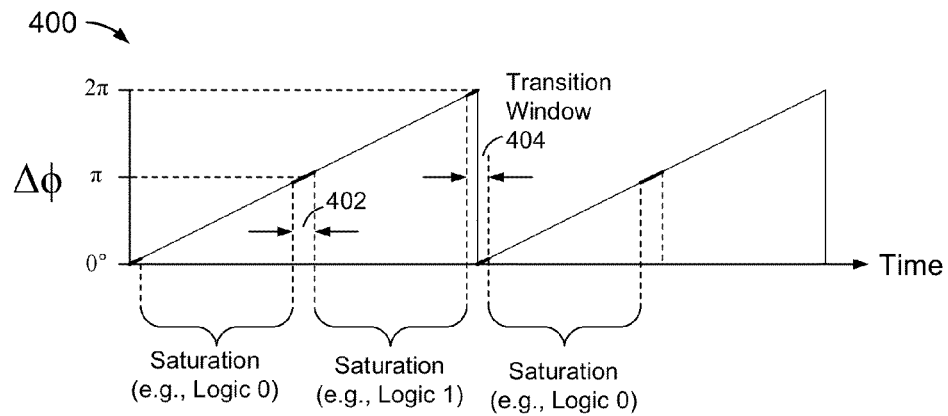
FIG. 4 is a timing diagram of a periodic linear ramp between 0 to $2\pi$, which may be applied to the system of FIG. 2 to generate calibration data.

A frequency of first clock 302 and/or second clock 304 may be controllable to maintain a relatively constant frequency difference such that the phase difference is a linear ramp that periodically transitions through 0° and 180°, such as illustrated in FIG. 4, which is discussed further below. FIG. 3 includes a transition through 180°.

At E1, first clock 302 is at Vss and the phase difference between clocks 302 and 304 is sufficiently large that all of samples 310-1 through 310-7 are logic 0 (i.e., saturated at logic 0), which may be encoded as digital value 302-1

At E2, first clock 302 is at Vss and the phase difference between clocks 302 and 304 remains sufficiently large that all of samples 310-1 through 310-7 remain in saturation at logic 0, which may be encoded as digital value 302-2.

At E6, E7, and E8, first clock 302 is at Vcc and the phase difference is sufficiently large (and increasing), that samples corresponding sets of samples 310 are in saturation at logic 1, which may be encoded as corresponding digital values 302-6, 302-7, and 302-8.

In the example of FIG. 3, phase differences at E2 and E6 are similar to one another in magnitude, with opposite signs. This is indicative of a phase difference transition through 0° or 180° approximately midway between E2 and E6.

Specifically, at some point between E2 and E6, the state of first clock 302 at rising edges of second clock 304 transitions from Vss to Vcc. Due to variations amongst the stochastic circuits, the event at which one of the stochastic circuits captures the new state of first clock 302 (Vss in this example), may differ from the event at which another one of the stochastic circuits first captures the new state of first clock 302.

In the example of FIG. 3:
  stochastic circuits that provide samples 310-3, 310-5, and 310-6 detect the transition at E3;
  stochastic circuits that provide samples 310-2 and 310-7 detect the transition at E4;

the stochastic circuit that provides sample 310-1 detects the transition at E5; and the stochastic circuit that provides sample 310-4 detects the transition at E6.

The sample set 310 for each of E3 through E6 may be encoded as a corresponding one of digital values 302-3, 302-4, 302-5, and 302-6.

A graph 329 illustrates an incremental progression of digital values 302, from 000 to 111, as the phase difference transitions through 180°. During a subsequent transition through 0°, digital values 302 may decrement from 111 to 000 over a series of events.

Incremental changes in digital values 302 may represent a relatively precise measure (or relative measure) of the phase difference between first and second signals 302 and 304 as the phase difference approaches and/or transitions through 0° and/or 180°.

A transition window may be defined to encompass a series of events for which one or more stochastic circuits first detect a transition, such as E3 through E6 in FIG. 3, or a subset thereof. The transition window may be invoked when a first one or more of the stochastic circuits detect the transitions, such as at E3 in FIG. 3. The transition window may encompass a number of subsequent events (e.g., E4, E5, and E6). The number of events within a transition window may be pre-determined, configurable, and/or dynamically variable.

In FIG. 2, event selector 212 may include a transition detector to initiate a transition window when stochastic circuits 108 exit a saturation state.

FIG. 4 is a timing diagram of a phase difference ($\Delta\phi$) 400, illustrated here as a periodic linear ramp between 0 to $2\pi$. $\Delta\phi$ 400 may correspond to a fixed frequency difference between first and second signals, such as described above with respect to first and second clocks 302 and 304 in FIG. 3.

A first transition window 402 includes $\Delta\phi=\pi$, where the first and second signals are 180° out of phase with one another. A second transition window 404 includes $\Delta\phi=2\pi$, where the first and second signals are in phase with one another. Samples of phase difference 400, within window 402 and/or window 404, may be selected for further processing, such as described above with respect to FIG. 2 and/or FIG. 3.

Compensation and calibration are discussed below with reference to FIGS. 1-4. Compensation and calibration are not, however, limited to the examples FIGS. 1-4.

Outputs of a set of n stochastic sampling circuits may transition between saturation states over a sequence of j events. In the example of FIG. 3, n=7 and j=4.

Due to the random characteristics of stochastic sampling circuits, each of the n outputs may transition at a random one of the m events. Where the n outputs for each event are encoded as a digital value, a transition of the n outputs between saturation dates provides a corresponding transition of the digital value between 0 and n.

Due to the random characteristics of the stochastic sampling circuits, the digital value may increment between 0 and n, in any of a number of combinations of j step sizes that sum to n. In the example of FIG. 3, from E1 to E6, digital value 302 increments from 000 to 111 in decimal or based 10 increment sizes of 3, 2, 1, and 1.

Table 1 provides a non-exhaustive list of combinations sequences of j increments that total n for the example of FIG. 3, where n=7 and j=4. The first example, TW1, corresponds to FIG. 3. Additional examples in Table 1 are denoted TW2, TW3, and TW4. Methods and systems disclosed herein are not, however, limited to the example of FIG. 3 or Table 1.

TABLE 1

| | Step Sizes | | | |
|---|---|---|---|---|
| Example | Initial Event | Second Event | Third Event | Fourth Event |
| TW1 | 3 | 2 | 1 | 1 |
| TW2 | 1 | 2 | 3 | 1 |
| TW3 | 2 | 2 | 2 | 1 |
| TW3 | 1 | 5 | 0 | 1 |
| . | . | . | . | . |
| . | . | . | . | . |
| . | . | . | . | . |

Where a set of n stochastic circuits has a linear transfer function, is driven by a linear phase difference ramp, such as $\Delta\phi$ 400 in FIG. 4, and where each set of n outputs are encoded as a digital value, the probability distribution of the digital value, for a sequence of j increments between 0 and n, is uniformly distributed amongst the combinations of possible sequences, such as illustrated in Table 1.

Where the set of n stochastic circuits does not have a linear transfer function, the probability distribution is not uniformly distributed. As described below, a non-uniform distribution may be used to determine digital compensation.

In FIG. 2, TDC system 200 includes a compensation module 222 to compensate digital values 218 to correct for non-linearity of stochastic system 106. In another embodiment, compensation module 222 may be configured to compensate stochastic data 214.

A calibration module 232 may be configured to determine compensation parameters 230 for compensation module 222 based on calibration data 215. In the example of FIG. 2, calibration module 232 includes a non-linear estimation module 234 to estimate non-linearity based on calibration data 215. Calibration module 232 further includes and a parameter module 236 to determine compensation parameters 230 based on the estimated non-linearity.

Non-linear estimation module 234 may be configured to perform a histogram analysis of calibration data 215. A histogram is a graphical or tabular representation of the distribution of data. It is an estimate of the probability distribution of a continuous variable. A histogram is a representation of tabulated frequencies, shown as adjacent rectangles, erected over discrete intervals (bins), with an area equal to the frequency of the observations in the interval. The height of a rectangle is also equal to the frequency density of the interval, or the frequency divided by the width of the interval. The total area of the histogram is equal to the number of data.

A histogram may be normalized to relative frequencies to show the proportion of cases that fall into each of several categories, with the total area equaling 1. The categories may represent consecutive, adjacent, non-overlapping intervals of a variable, such as increments of calibration data 215 between 0 and n.

A histogram may be used to plot the density of data and/or for density estimation (i.e., to estimate the probability density function of the underlying variable). The total area of a histogram used for probability density may be normalized to 1. If the length of each intervals on the x-axis is 1, the histogram is identical to a relative frequency plot.

Non-linear estimation module 234 is not, however, limited to histogram analysis. Non-linear estimation module 234 may, for example, be configured to compute a kernel density estimation, which uses a kernel to smooth samples. Kernel density estimation may provide a relatively smooth probability density function, which may more accurately reflect the underlying variable.

Figure 5:
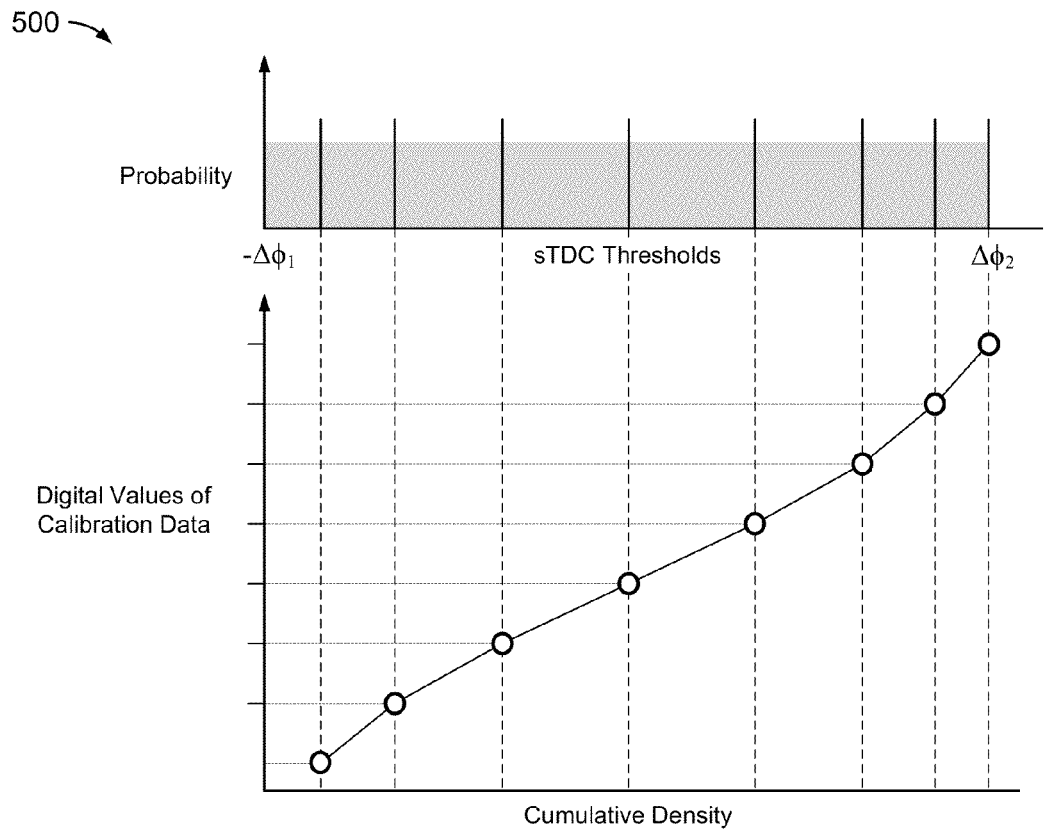
FIG. 5 is a histogram for an example set of calibration data to illustrate non-linearity stochastic system of FIG. 2, from which digital compensation may be determined.

FIG. 5 is a histogram 500 for an example set of calibration data for a non-linear stochastic system driven by a periodic linear ramp (e.g., calibration data 215 in FIG. 2). Histogram 500 illustrates cumulative density and probability distribution.

Vertical hash-lines represent thresholds for each increment of the digital value between 0 and n. Unequal spacing between the vertical hash-lines is indicative of non-linearity of the stochastic system. Non-linearity of a stochastic system may thus be measured and/or estimated from a histogram analysis.

The output of a non-linear stochastic system driven by a ramp is equivalent to that of a linear stochastic system driven by an appropriately distorted ramp (e.g., similar histograms). A non-linear stochastic system driven by a ramp may thus be modeled as a linear stochastic system preceded by a distortion block driven by the ramp. The non-linearity of the distortion block may be compensated with digital post-distortion (e.g., with digital distortion of digital values 218 in FIG. 2).

In FIG. 2, parameter module 236 is configured to determine or select compensation parameters 230 to correct for, reverse, undo, and/or otherwise negate or compensate for non-linearity of stochastic system 206.

Compensation module 222 may be configured to translate or map digital values 218 to appropriate corrected phase indications, illustrated here as compensated digital values 224. Compensation module 222 may include a look-up table, which may be pre-configurable and/or dynamically re-configurable with compensation parameters 230. Compensation module 222 is not, however, limited to look-up tables.

A stochastic system may be configured as part of a phase lock loop (PLL), such as described below with reference to FIG. 6.

Figure 6:
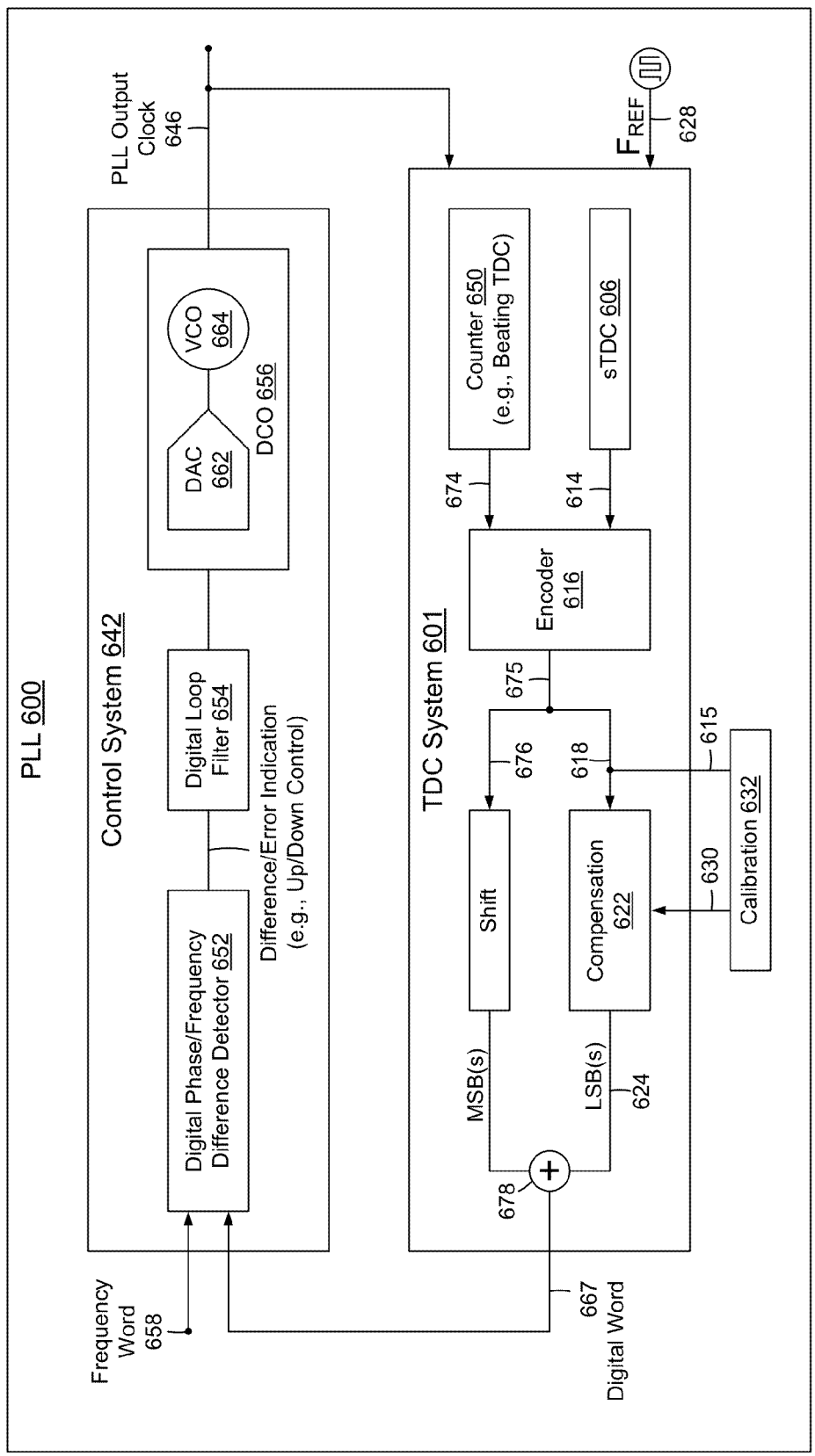
FIG. 6 is a block diagram of a phase lock loop (PLL) that includes a TDC system that has a stochastic TDC (sTCD) and a beating TDC (bTDC).

FIG. 6 is a block diagram of a phase lock loop (PLL) 600 that includes a TDC system 601 to measure a phase difference between a PLL clock 646 and a reference clock 628, and encode the phase difference as a digital word 667. PLL 600 further includes a control system 642 to control PLL clock 646 based on digital word 667 and a frequency word 658. Control system 642 may be configured to adjust PLL clock 646 to reduce or minimize a difference between frequency word 658 and digital word 667.

In FIG. 6, control system 642 includes a digital phase and/or frequency difference detector 652, a digital loop filter 654, and a digitally controllable oscillator (DCO) 656. DCO 656 may include a digital-to-analog converter (DAC) 662 to control a voltage controllable oscillator (VCO) 662 based on an output of digital loop filter 654. In this example, PLL 600 may be referred to as a digital PLL or an all-digital PLL.

TDC system 601 includes a stochastic TDC (sTDC) 606 to provide stochastic data or samples 614 indicative of a phase of PLL clock 646 relative to an event or a selected event, such as described in one or more examples herein.

TDC system 601 further includes a system 650 to provide a measure 674 of a delay between a transition of reference clock 628 and the event, or between the transition of reference clock 628 and a transition window that includes the event.

System 650 may include, without limitation, a counter, such as a recirculating counter, which may include a linear feedback shift register (LFSR). System 650 may be referred to herein as a re-circulating TDC and/or a beating TDC (bTDC), and TDC system 601 may be referred to herein as a stochastic beating TDC or sbTDC. A sbTDC may be configured to operate with relatively low power consumption, a relatively small footprint, while providing relatively high resolution.

TDC system 601 further includes a digital encoder 616 to combine and encode stochastic data 614 and delay measure 674 as a digital value 675, to represent a phase difference between PLL clock 646 and reference clock 628, from 0 to $2\pi$.

In an embodiment, digital encoder 616 is configured to combine stochastic data 614 and delay measures 674 generated over a measurement period, and to encode the combined data as digital value 675. In another embodiment, digital encoder 616 is configured to combine and encode stochastic data 614 and delay measure 674 as a digital value 675 for each event or for each selected event in a continuous or real-time process.

In FIG. 6, digital value 675 includes first and second portions, illustrated here as a first digital value 618 and a second digital value 676, respectively. First digital value 618 may inherit or exhibit non-linearity of sTDC 606. Second digital value 676 may inherit or exhibit linearity of bTDC 650.

TDC system 601 further includes a compensation module 622 to compensate first digital value 618 for non-linearity of sTDC 606, to provide a corresponding compensated first digital value 624.

TDC system 601 further includes a word constructor 678 to construct a digital word 667 based on first digital value 618 and second digital value 674.

Word constructor 678 may, for example, populate most significant bits (MSBs) of digital word 557 with second digital value 764, as a relatively coarse measure of a phase difference between DCO clock 646 and reference clock 628. Word constructor 678 may populate least significant bits (LSBs) of digital word 557 with compensated first digital value 718, as a relatively precise measure of the phase difference.

Figure 7:
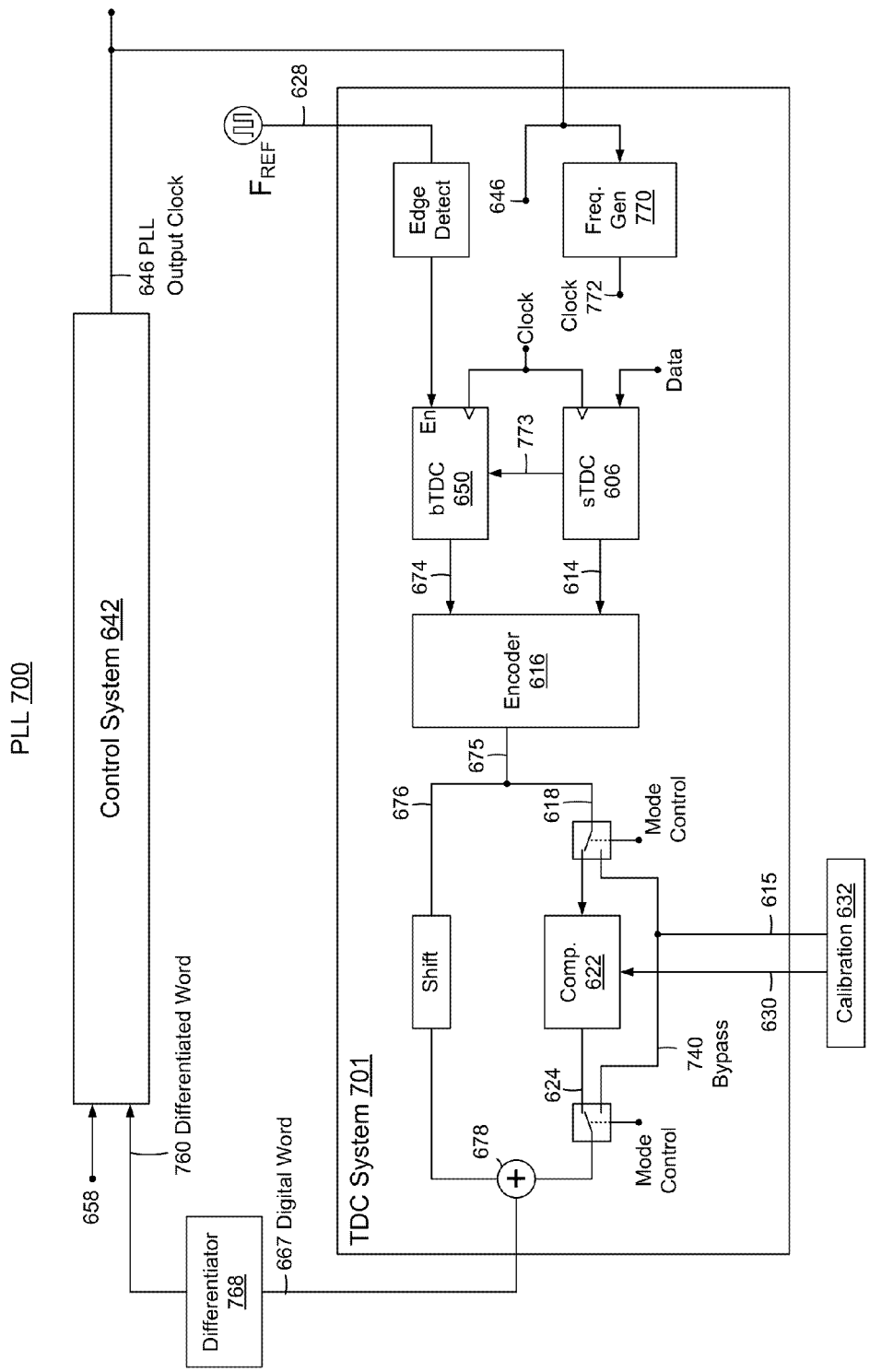
FIG. 7 is a block diagram of another PLL 700, including features described above with respect to FIG. 6, and further including having a frequency generator and a compensation bypass.

FIG. 7 is a block diagram of a PLL 700, including features described above with respect to PLL 600 in FIG. 6, and further including a frequency generator 770 and a compensation bypass 740 within a TDC system 701.

Frequency generator 770 is configured to control a clock 772 to maintain a substantially fixed frequency difference between clock 772 and PLL clock 646, such as described in one or more examples herein. Frequency generator 770 may be configured to generate clock 772 directly from PLL clock 646, and/or indirectly, such as from a digital representation of PLL clock 646, which may be provided by digital encoder 616. Frequency generator 770 may include a fractional frequency generator and/or a digitally controllable frequency generator, and may include a digitally controllable triggered ring oscillator (TRO).

sTDC 606 may be configured to sample a phase difference between PLL clock 646 and clock 772. For example, one of PLL output clock 646 and clock 772 may be applied to a data port of sTDC 606, and the other one of PLL output clock 646 and clock 772 may be applied to a clock port sTDC 606.

The clock applied to the clock port of sTDC 606, or a phase thereof, may be applied to a clock port of bTDC 650.

bTDC 650 may be configured to count cycles of the applied clock upon a transition of reference clock 628.

sbTDC 650 may include event driven memory (EDM) to store the count upon a trigger or event 773 from sTDC 606. Event 773 may correspond to a selected event and/or a start of a transition window. bTDC 650 may be configured to output the stored count as delay measure 674.

In an embodiment, sTDC 606 includes multiple sets of n stochastic sampling circuits, each to provide a corresponding set of n samples per event, and frequency generator 770 is configured to provide each set of stochastic sampling circuits with a corresponding one of multiple phases of clock 772 or PLL clock 646. An example is provided below with reference to FIG. 8.

In FIG. 7, compensation bypass 740 is controllable to provide uncompensated first digital values 618 to word constructor 678 in place of compensated first digital values 624, and to provide the uncompensated first digital values 618 to calibration module 632 as calibration data 615. This may be useful, for example, to generate calibration data 630 that reflects non-linearities of sTDC 606.

PLL 700 may include a differentiator 768 to provide differentiated digital phase words 760 to control system 642, based on digital phase words 667.

Figure 8:
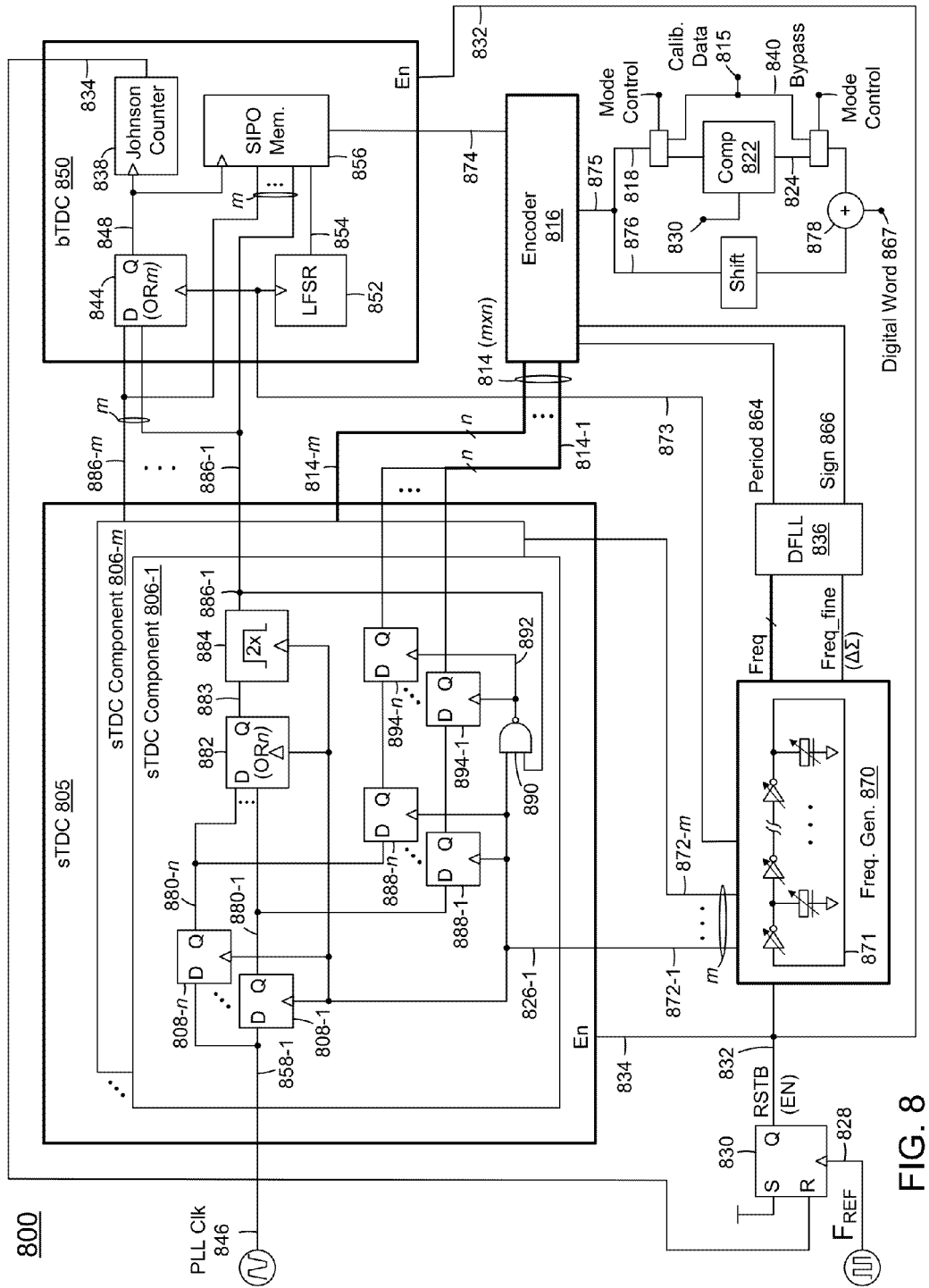
FIG. 8 is a logic diagram of a TDC system that includes multiple sets of stochastic sampling circuits.

FIG. 8 is a logic diagram of a TDC system 800 that includes multiple sets of stochastic sampling circuits.

TDC system 800 includes a sTDC 805, and a beating TDC (bTDC) 850 with event driven memory (EDM). TDC system 800 may be referred to herein as a sbTDC with EDM, or sbTDC 800. sbTDC 800 is described below with reference to timing diagrams in FIG. 9. sbTDC 800 is not, however, limited to the examples of FIG. 9.

sTDC 805 includes one or more sTDC components, illustrated here as sTDC components 806-1 through 806-$m$. Each sTDC component 806 includes a corresponding set of stochastic sampling circuits (stochastic circuits) 808-1 through 808-$n$. A stochastic circuit 808 may include, without limitation, a latch such as a data flip-flop (D-FF).

In an embodiment, n=8 and m=4. Methods and systems disclosed herein are not, however, limited to these examples, as n may be greater or less than 8, and m may be greater or less than 4.

Figure 9:
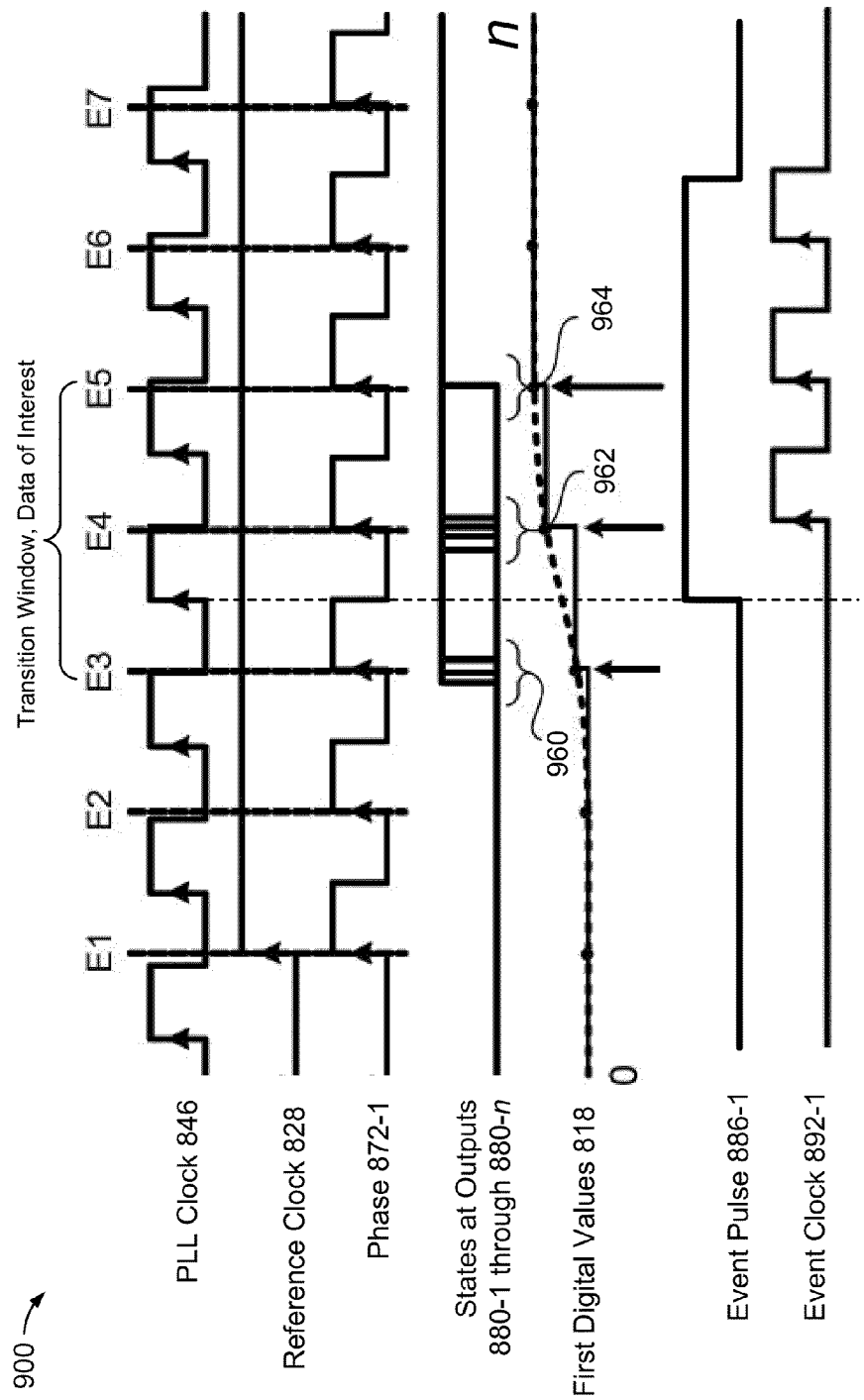
FIG. 9 depicts timing diagrams for the TDC system of FIG. 8.

Each sTDC component 806 is configured to sample a phase difference between a corresponding data input 858 and a corresponding sTDC clock 826, at periodic events defined by the sTDC clocks 826, such as events E1 through E7 in FIG. 9.

sbTDC 800 further includes a frequency generator 870 to generate a clock 871. Frequency generator 870 may be configured to generate clock 871 with a period that is a ratio of the period of PLL clock 846. The period of clock 871 may be greater or less than the period of PLL clock 846. The ratio may be pre-determined, selectable, and/or dynamically configurable.

For m=1, clock 871 is applied as sTDC clock 826-1 of a sTDC component 806-1 and PLL clock 846 is applied as data input 858-1 of sTDC component 806-1, to sample a phase difference between clock 871 and a PLL clock 846.

For m>1, frequency generator 870 is configured to generate multiple phases of clock 871, illustrated here as including phases 872-1 through 872-$m$. Each of the m phases 872 is applied as the sTDC clock 826 of a corresponding one of sTDC components 806, and PLL clock 846 is applied as the data input 858 of each sTDC component 806, to sample a phase difference between PLL clock 846 and a corresponding one of phases 872.

For m>1, sTDC 805 may be referred to herein as a multi-phase sTDC. A multi-phase sTDC may be useful to spread a load of stochastic circuits amongst multiple taps of frequency generator 870.

Frequency generator 870 may include a digitally controllable triggered ring oscillator (DC-TRO), to receive a digital representation of PLL clock 846 from a digital encoder 816. In FIG. 8, the digital representation includes a digital representation 864 of a period of PLL clock 846, and a phase difference sign 866. Digital encoder 816 may be configured to provide digital indications 864 and 866 based on outputs of sTDC 805 and bTDC 850.

sTDC component 806-1 is described below. Other ones of sTDC components 806 may be configured similar to sTDC component 806-1.

In sTDC component 806-1, each stochastic circuit 808-1 through 808-$n$ is configured to present a captured state or sample at a corresponding one of outputs 880-1 through 880-$n$, for each event. A set of n samples for an event may be referred to herein as a sample set or an event sample set.

sTDC component 806-1 further includes hold circuitry to temporarily hold or latch each sample set from outputs 880. In FIG. 8, the hold circuitry includes D-FFs 888-1 through 888-$n$ to latch each sample set for a period of phase 872-1.

sTDC component 806-1 further includes an event selector to select events within a transition window in which the phase difference between PLL clock 846 and phase 872-1 transitions through 0° or 180°. In FIG. 8, the event selector includes a detection device 882 to detect an exit from a state in which outputs 880 are saturated at logic 0 or logic 1. In FIG. 8, detection device 882 includes a D-FF to OR outputs 880-1 through 880-$n$, and assert a detection indication 883 when one or more of outputs 880 change from logic 0 to logic 1.

The event selector further includes an edge differentiator 884 to generate an event pulse 886-1 based on detection indication 883. Event pulse 886-1 may represent a transition window within which events are selected, such as described in one or more examples herein.

In FIG. 8, edge differentiator 884 is illustrated as a 2× device to assert event pulse 886-1 for 2 periods of clock phase 872-1. In this example, edge differentiator 884 may include two flip-flops and/or other logic to delay and/or extend detection indication 883 for two periods of phase 872-1.

The event selector further includes an activation device 890 to activate an event clock 892 for a duration of event pulse 886-1. In FIG. 8, activation device 890 includes NAND logic to activate event clock 892 as an inverted version of phase 872-1.

The event selector further includes transfer devices 894 to transfer a set of n samples, 814-1, from the hold circuitry to digital encoder 816, for each event within event pulse 886. In FIG. 8, transfer devices 894 include D-FFs clocked by event clock 892.

Each event detected by sTDC component 806-1 may also be detected by remaining ones of sTDC components 806-2 through 806-$m$, based on corresponding phases 872-2 through 872-$m$, to provide digital encoder 816 with a set of n samples from each of TDC components 806-1 through 806-$m$ (i.e., sample sets 814-1 through 814-$m$ in FIG. 8), for a total of n×m samples per event. For the example above, where n=8 and m=4, encoder 816 is provided with 32 samples per event.

bTDC 850 is configured to measure a delay from a transition of reference clock 828 to a transition window (i.e., event pulse 886-1), or an event within the transition window (i.e., event clock pulses 892). bTDC 850 may be configured to count cycles of a phase 873 of clock 871, from an edge of reference clock 826 (E1 in FIG. 9), to the start of event pulse 886-1. bTDC 850 may include a single counter to count cycles of phase 873 upon an event pulse 886 of any one or more of sTDC components 806.

In FIG. 8, bTDC 850 includes a counter 852 to count periods of clock phase 873 upon assertion of an enable control 832, which is indicative of a transition of reference clock 828. Counter 852 may include a circulating counter, which may include a linear feedback shift register (LFSR).

bTDC 850 further includes memory 856 to store a count 854 on demand. Memory 856 may be configured to store count 854 when an event pulse 886 is asserted by any one or more of sTDC components 806. Memory 856 may be configured to store count 854 for each sTDC components 806 based a corresponding event pulse 886.

In FIG. 8, bTDC 850 includes a trigger device 844 to assert a trigger 848 when an event pulse 886 is asserted by any of sTDC components 806. Trigger 848 is applied to a clock port of memory 856 to trigger memory 856 to store a current value of count 854. Memory 856 may be further configured to associate each stored count 854 with an indication of the sTDC component 806 that triggered storage of the count.

Memory 856 is configured to provide the stored count(s) to digital encoder 816 as a delay measure, or delay data 874. Memory 856 may be configured to store count 854 until a count is stored for each sTDC component 806. Memory 856 may include, without limitation, serial-in parallel-out (SIPO) memory.

Digital encoder 816 may be configured to combine delay data 874 from bTDC 850 and stochastic data 814 from sTDC 805 (i.e., stochastic data 814-1 through **814-*m* from corresponding sTDC components 806-1 through 806-*m*), as a digital value 875. Digital value 875 may include n×m bits to represent a phase difference between PLL clock 846 and reference clock 828**, from 0 to 2π.

In FIG. 8, digital value 875 includes first and second portions, illustrated here as a first digital value 818 and a second digital value 876, respectively. First digital value 818 may exhibit non-linearity of sTDC 805, and second digital value 876 may exhibit linearity of bTDC 850. The number of bits in first digital value 818 may approximately equal to $\log^2(n \times m)$.

sbTDC system 800 further includes a compensation module 822 to compensate first digital value 818 for non-linearity of sTDC 805 based on compensation parameters 830, such as described in one or more examples herein.

sbTDC system 800 further includes a word constructor 878 to construct a digital word 867 based on a compensated first digital value 824 and second digital value 876, such as described in one or more examples herein.

sbTDC system 800 further includes a bypass 840 to provide uncompensated first digital values 818 to word constructor 878 and/or to provide uncompensated first digital values 818 to a compensation module as calibration data 815, such as described in one or more examples herein.

FIG. 9 depicts timing diagrams for sTDC component 806-1 in FIG. 8.

Stochastic data of interest may occur near a point or time at which PLL clock 846 is in phase with clock phase 872-1. In FIG. 9, PLL clock 846 in phase with clock phase 872-1 when transitions or edges of PLL clock 846 and clock phase 872-1 align or cross one another. A crossover of the edges is referred to herein as a transition edge.

In FIG. 9, transitions are illustrated with respect to rising edges of PLL clock 846 and clock phase 872-1. Alternatively, transitions may be based on falling edges.

Because of random variations amongst stochastic circuits 808 within sTDC component 806-1 stochastic circuits 806-1 through **806-*n* detect the transition edge of PLL clock 846 at various events within a transition window (i.e., within event pulse 886-1). In FIG. 9, stochastic circuits 806-1 through 806-*n* detect the transition edge of PLL clock 846 from E3 through E5. Events E3, E4, and E5 may thus be deemed to hold data of interest. A duration of event pulses 886-1 through 886-*n*** may be pre-determined, variable, and/or dynamically configurable, such as to encompass a desired number of events.

In an embodiment, the event pulses 886 are configured to encompass less than 5 events, such as 3 or 2. In another embodiment, event pulses 886 are configured to encompass 5 or more events.

In a multi-phase embodiment, data of interest may occur from the first transition of a circuit 808 of one sTDC component 806, to the last transition of a circuit 808 of another sTDC component 806.

A transition window (i.e., event pulse 886) may represent a relatively small portion of a period of reference clock 828. Outside of the transition window, all of sTDC components 806 may be saturated at logic 0 or logic 1. In the example of FIG. 9, outputs 880 are in saturation at logic 0 at E1 and E2, and at logic 1 at E6 and E7.

In FIG. 9, outputs 880 of three stochastic circuits 806 transition at E3, denoted here as 960. Four additional outputs 880 transition at E4, denoted here as 962. An eighth output 880 transitions at E5, denoted here as 364.

Instead of processing potentially vast amounts of saturated stochastic data outside of the transition window, processing/storage of stochastic data may be limited to that which is captured during transition windows. Resultant stochastic phase difference data 814 may be combined with delay data 874 from bTDC 850 (FIG. 8) to provide a phase difference between PLL clock 846 and reference clock 828. This may reduce complexity, space requirements, and/or costs.

In FIG. 8, sbTDC 800 further includes reset circuitry 838 to assert a reset control 834 following a transition window. Reset circuitry 838 may be configured to assert reset control 834 when a count 854 is stored for each sTDC component 806. Reset circuitry 838 may include a counter, such as a Johnson counter, to count triggers 848, and to assert reset control 834 when the count equals m. In an embodiment, trigger device 844 and/or reset circuitry 838 is configured such that reset control 834 is activated after deactivation of m event pulses 866, such as to provide time for processing of the corresponding last of m sample sets 814.

Reset circuitry 838 may be configured to deactivate reset control 834 when enable control 832 is asserted.

sbTDC 800 further includes enable circuitry 830 to assert enable control 832 upon a transition of reference clock 828. Enable circuitry 830 may include a set-reset flip-flop (SR-FF) configured as a SR-NOR latch.

Enable control 832 and/or reset control 834 may be used to enable, disable, reset and/or initialize one or more other features of sbTDC 800, such as stochastic circuits 808, frequency generator 870, counter 852, and/or memory 856.

bTDC 850 and/or digital encoder 816 may be configured to determine polarity (e.g., sign 886) of a phase difference between PLL clock 846 and clock 871, which may be used to close a loop between PLL clock 846 and clock 871. Polarity may be detected through comparison of phases 872 of clock 871, and/or through comparison of multiple phases of PLL clock 846. Polarity detection circuitry may be embedded within sbTDC 800, such as by distributing sTDC components 806 along stages of frequency generator 870.

sbTDC 800 may be configured as part of a digitally controllable phase lock loop (PLL), such as described in one or more examples herein. Such a PLL may be configured to generate PLL clock 846 in accordance with a standard, such as Institute of Electrical and Electronics Engineers (IEEE) 802.11ac, 802.16e, and/or 802.16m-2011, and/or a standard or Release 8, 9, 10, or 11 of a third generation partnership project (3GPP) long term evolution (LTE).

sTDC 805 may provide a relatively precise resolution with respect to events with a transition window (e.g., within an event pulse 886). Events outside of an event window may be discarded, such as to avoid storing excessive amounts of saturated stochastic data. This may reduce complexity, area, and/or power consumption.

bTDC 850 may provide a relatively coarse resolution or step size, which may be on the order of a period of clock 871, over a relatively extensive range.

A combination of sTDC 806 and bTDC 850 may provide relatively precise phase measurements over a relatively extensive range.

A digitally controllable PLL having digital compensation to compensate for non-linearity of the stochastic system, as disclosed herein, may be useful in, without limitation, a wireless device or node of a wireless network.

A digitally controllable PLL having digital compensation to compensate for non-linearity of the stochastic system, as disclosed herein, may be useful to provide relatively high resolution and linear digital phase data in high data rate or clock rate applications, with relatively low power and area consumption, which may useful to generate a local oscillator (LO) that meets evolving standards of Giga-Bit-Per-Second wireless standards and/or for other applications.

A digitally controllable PLL having digital compensation to compensate for non-linearity of the stochastic system, as disclosed herein, may be useful in porting designs to new process technologies.

One or more features disclosed herein may be implemented in, without limitation, circuitry, a machine, a computer system, a processor and memory, a computer program encoded within a computer-readable medium, and/or combinations thereof. Circuitry may include discrete and/or integrated circuitry, application specific integrated circuitry (ASIC), a system-on-a-chip (SOC), and combinations thereof.

Figure 10:
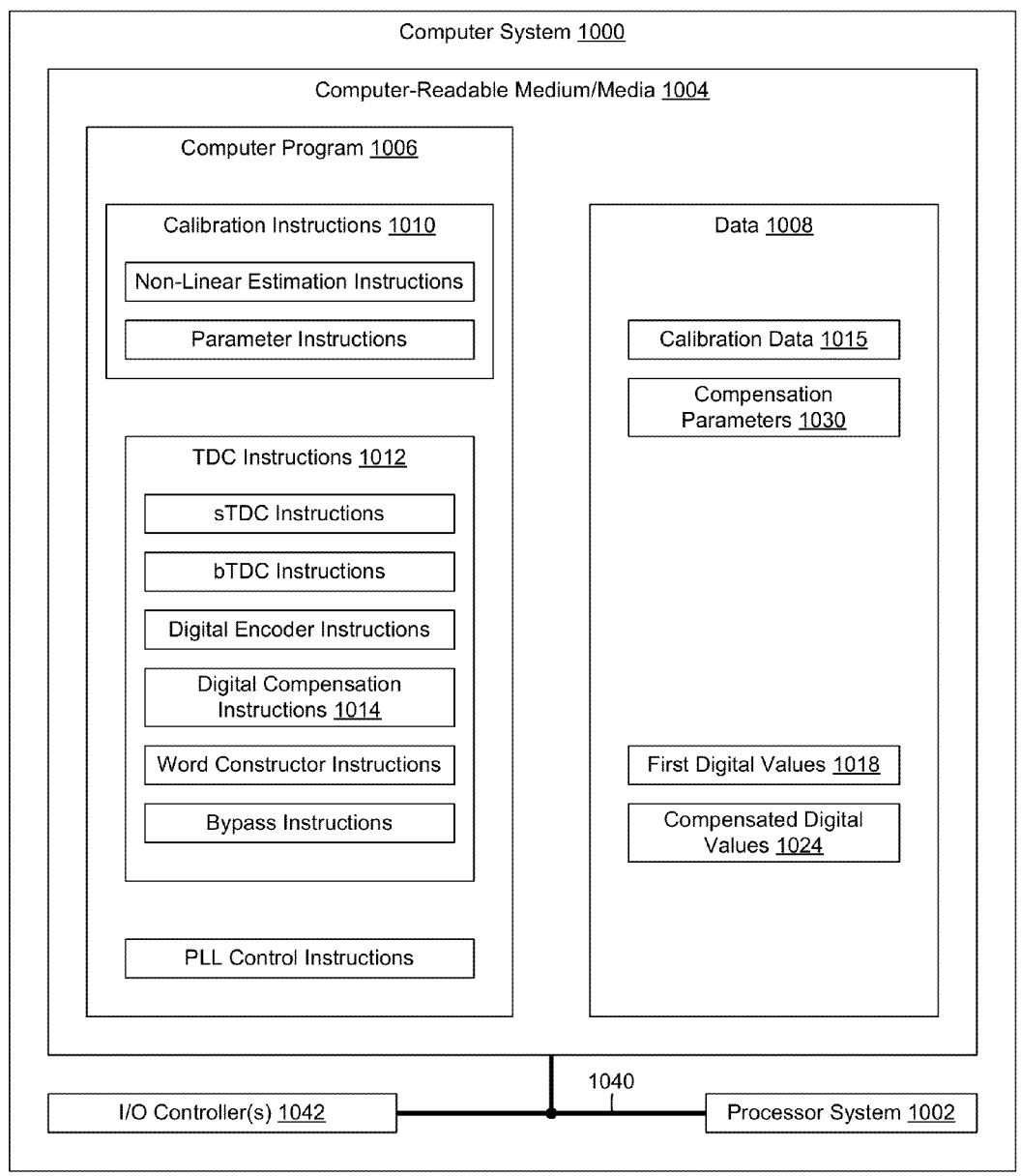
FIG. 10 is a block diagram of a computer system configured to determine digital compensation parameters to compensate for non-linearity of a stochastic system.

FIG. 10 is a block diagram of a computer system 1000 configured to determine digital compensation parameters to compensate for non-linearity of a stochastic sampler. The stochastic sampler may be part of a sTDC of a sbTDC system, which may be configured to measure and digitally encode a phase difference between first and second clocks, such as described in one or more examples herein. Computer system 1000 may be further configured to perform one or more features of the sTDC and/or sbTDC system. Computer system 1000 includes one or more processors, illustrated here as a processor 1002, to execute instructions of a computer program 1006. Processor 1002 may include one or more instruction processors and/or processor cores, and may further include a control unit to interface between the instruction processor(s)/core(s) and a computer readable medium 1004. Processor 1002 may include, without limitation, one or more of a microprocessor, a graphics processor, a physics processor, a digital signal processor, a network processor, a front-end communications processor, a co-processor, a management engine (ME), a controller or microcontroller, a central processing unit (CPU), a general purpose instruction processor, an application-specific processor.

Computer readable medium 1004 may include a non-transitory computer-readable medium, and may include a medium as disclosed below with reference to FIG. 11. Medium 804 is not, however, limited to the examples of FIG. 11.

Figure 11:
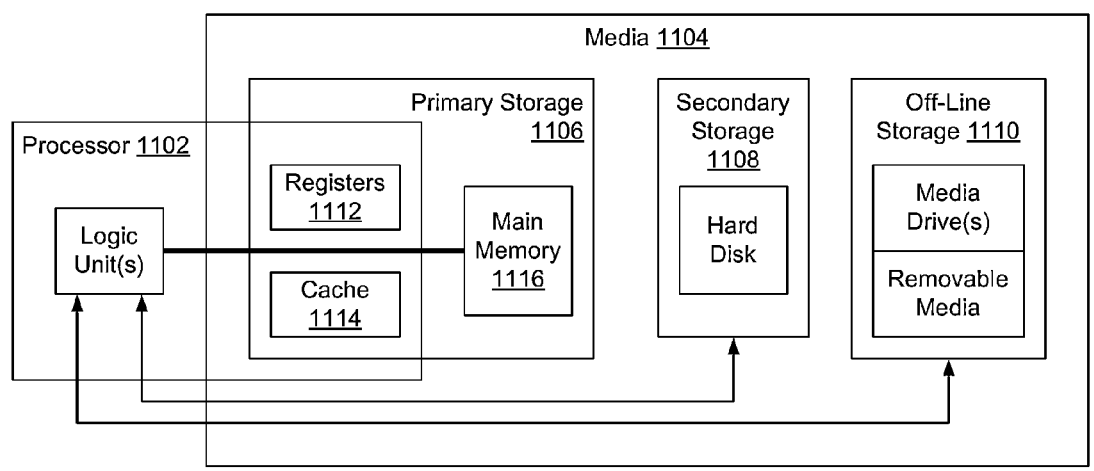
FIG. 11 is a block diagram of example computer-readable media that may be provided in the computer system of FIG. 10.

FIG. 11 is a block diagram of a processor 1102 and computer-readable medium 1104. In FIG. 11, medium 1104 includes primary storage 1106, secondary storage 1108, and off-line storage 1110.

Primary storage 1106 includes registers 1112, processor cache 1114, and main memory or system memory 1116. Registers 1112 and cache 1114 may be directly accessible by processor 1102. Main memory 1116 may be accessible to processor 1102 directly and/or indirectly through a memory bus. Primary storage 1106 may include volatile memory such as random-access memory (RAM) and variations thereof including, without limitation, static RAM (SRAM) and/or dynamic RAM (DRAM).

Secondary storage 1108 may be indirectly accessible to processor 1102 through an input/output (I/O) channel, and may include non-volatile memory such as read-only memory (ROM) and variations thereof including, without limitation, programmable ROM (PROM), erasable PROM (EPROM), and electrically erasable PROM (EEPROM). Non-volatile memory may also include non-volatile RAM (NVRAM) such as flash memory. Secondary storage 1108 may be configured as a mass storage device, such as a hard disk or hard drive, a flash memory drive, stick, or key, a floppy disk, and/or a zip drive.

Off-line storage 1110 may include a physical device driver and an associated removable storage medium, such as an optical disc.

In FIG. 10, medium 1004 includes a computer program 1006 encoded therein, which includes instructions to be executed by processor 1002. Medium 1004 further includes data 1008, to be used by processor 1002 during execution of computer program 1006 and/or generated by processor 1002 during execution of computer program 1006.

Computer program 1006 includes calibration instructions 1010 to cause processor 1002 to determine digital compensation parameters 1030 based on calibration data 1015. Calibration data 1015 may be generated as described in one or more examples above with respect to calibration data 215 in FIG. 2, 615 in FIG. 6, 615 in FIG. 7, and/or 815 in FIG. 8.

Calibration instructions 1010 may include non-linear estimation instructions to estimate non-linearity of the stochastic system, such as described above with reference to non-linear estimation module 234 in FIG. 2.

Calibration instructions 1010 may further include parameter instructions to determine digital compensation parameters 1030 to compensate for the non-linearity, such as described above with reference to parameter module 236 in FIG. 2.

In an embodiment, computer program 1006 further includes time-to-digital converter (TDC) instructions 1012 to cause processor 1002 to perform one or more TDC functions, such as described in one or more examples herein.

In FIG. 10, TDC instructions 1012 include digital compensation instructions 1014 to cause processor 1002 to compensate first digital values 1018 based on compensation parameters 1030, to provide compensated first digital values 1024. First digital values 1018 may correspond to digital values 218 in FIG. 2, 618, in FIG. 6, 618 in FIG. 7, and/or 818 in FIG. 8. Compensated first digital values 1024 may correspond to compensated digital values 224 in FIG. 2, 624 in FIG. 6, 624 in FIG. 7, and/or 824 in FIG. 8.

Computer system 1000 may include communications infrastructure 1040 to communicate amongst devices and/or resources of computer system 1000.

Computer system 1000 may include one or more input/output (I/O) devices and/or controllers 1042 to interface with one or more other systems.

Methods and systems disclosed herein may be implemented with respect to one or more of a variety of systems and/or devices, an example of which is provided below with reference to FIG. 12. Methods and systems disclosed herein are not, however, limited to the examples of FIG. 12.

Figure 12:
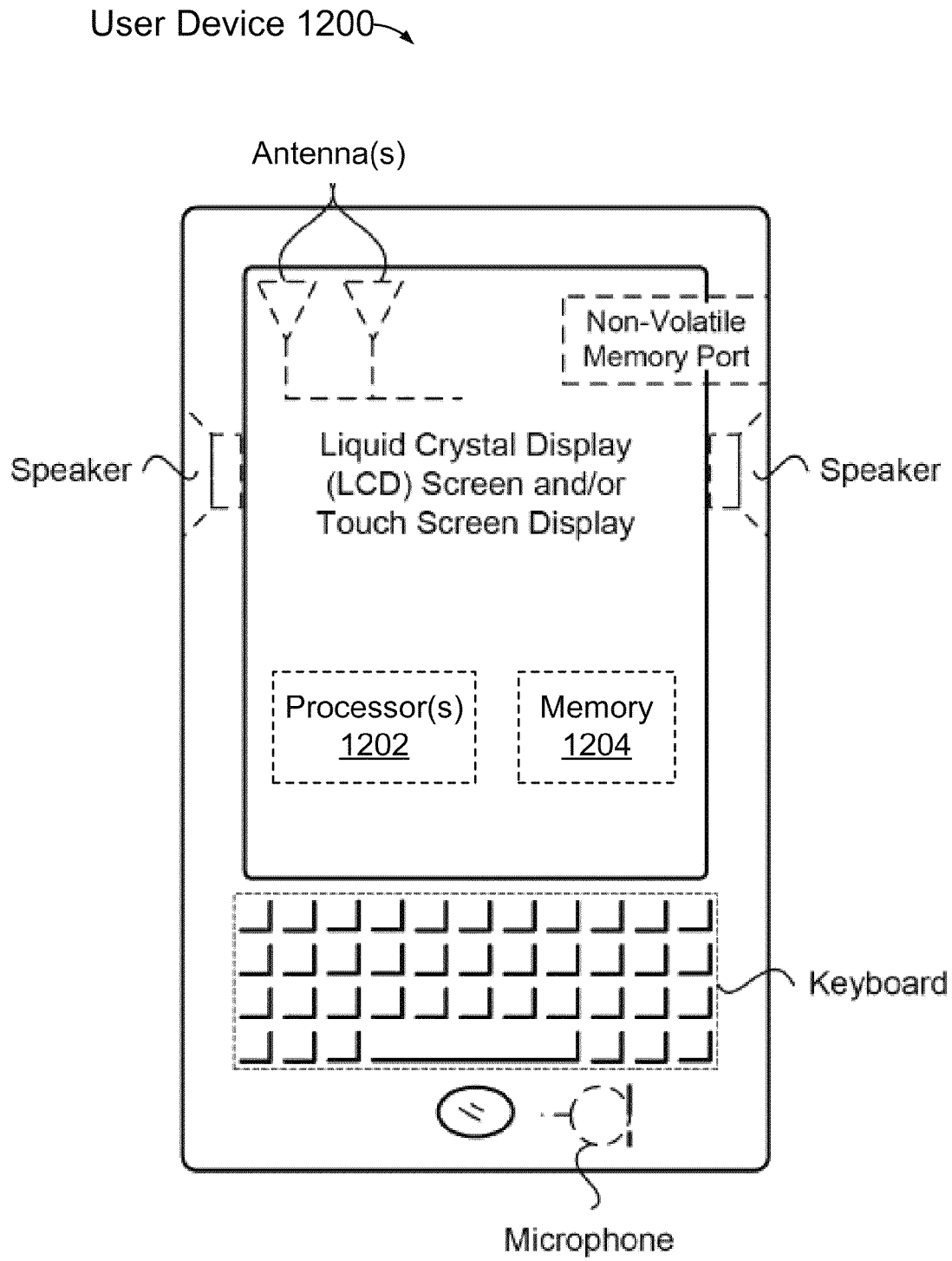
FIG. 12 is an illustration of a user device that includes a processor and memory, and a PLL to provide a clock to the processor and/or memory, where the PLL includes a stochastic sampling system and a digital compensation module to compensate for non-linearity of the stochastic sampling system.

FIG. 12 is an illustration of a user device 1200, including a processor 1202 and associated memory, cache, and/or other computer-readable medium, illustrated here as memory 1204.

Device 1200 may include a phase lock loop (PLL) to provide a clock to processor 1202 and/or memory 1204. The PLL may include a stochastic sampling system and a compensation module to compensate for non-linearity of the stochastic sampling system, such as described in one or more examples herein.

Device 1200 further includes a user interface, illustrated here as including a display, a keyboard, speakers, and a microphone. Device 1200 may include other interface devices such as, without limitation, a cursor device, a touch-sensitive device, a motion and/or image sensor, and/or a virtual keyboard on the display.

Device 1200 further includes a wireless communication system to communicate with an external communication network external network, which may include a packet-based network (e.g., a proprietary network and/or the Internet), and/or a voice network (e.g., a wireless telephone network).

Device 1200 may be configured as a portable/hand-held device, such as a mobile telephone or smart-phone and/or a computer system such as a laptop, notebook, net-book, note-pad, and/or tablet system, and/or other conventional and/or future-developed device(s). System 1200 may also be configured as a non-mobile device, such as desktop computer, a set-top box, and/or a gaming device. System 1200 is not, however, limited to these examples.

Figure 13:
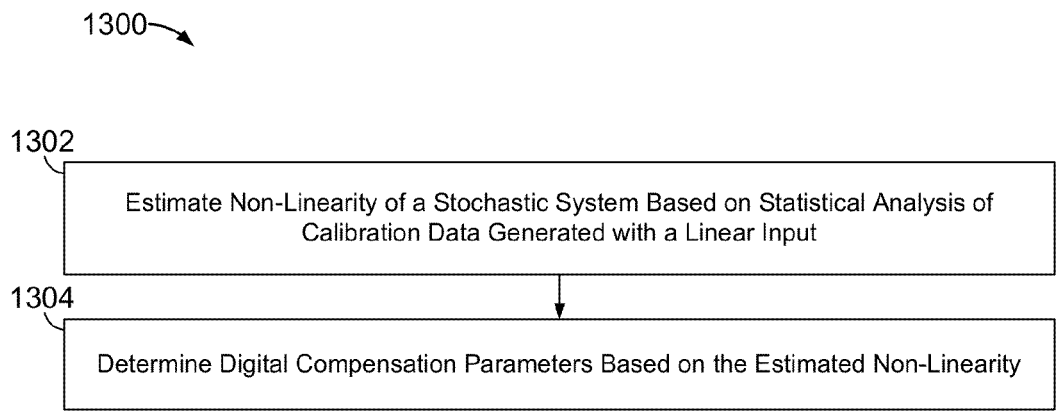
FIG. 13 is a flowchart of a method of determining digital compensation parameters to compensate for non-linearity of a stochastic system.

FIG. 13 is a flowchart of a method 1300 of determining digital compensation parameters to compensate for non-linearity of a stochastic system.

The stochastic system may be configured to sample a phase difference between first and second clocks, and may include a set of stochastic sampler circuits to sample a phase difference at periodic events.

At 1302, non-linearity of the stochastic system is estimated based on statistical analysis of calibration data. Statistical analysis may include histogram analysis to estimate the probability distribution of the calibration data.

The calibration data may be generated by the stochastic system based on a linear input, such as a linear ramp phase difference described in one or more examples herein.

The calibration data may include a digital value of a set of stochastic samples for each of multiple events. The calibration data may include sequences of the digital values in which the digital values increment over a range of the stochastic system (i.e., between saturation states of the stochastic system).

At 1304, compensation parameters are determined based on the estimated non-linearity.

Method 1300 may include estimating a probability distribution of the calibration data and determining compensation parameters to uniformly distribute the probability distribution.

Method 1300 may include estimating the cumulative distribution of the calibration data from a histogram of the calibration data, estimating the non-linearity of the stochastic sampler based on the cumulative distribution, modelling the non-linearity as a distortion block, and determining the compensation parameters based on the model of the distortion block.

Figure 14:
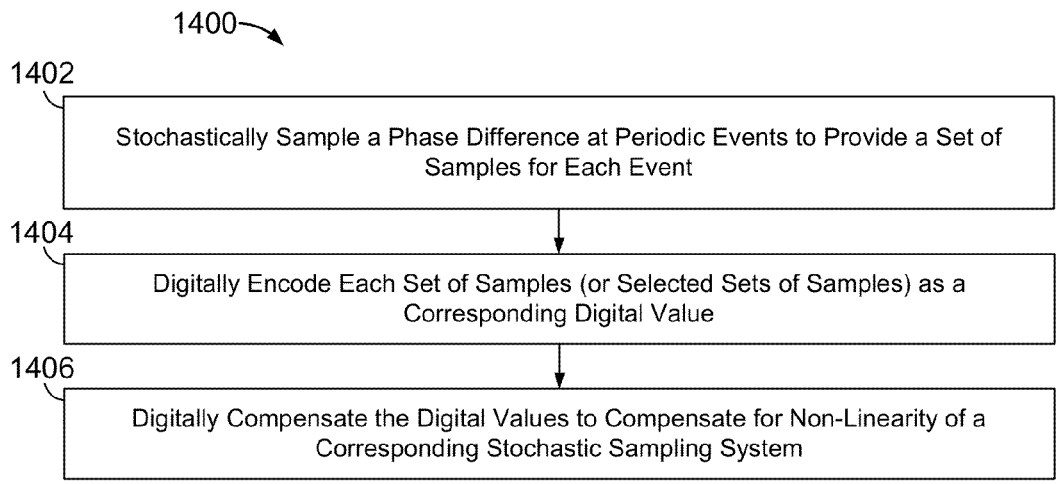
FIG. 14 is a flowchart of a method of generating and digitally compensating stochastic data to compensate for non-linearity of a corresponding stochastic system.

FIG. 14 is a flowchart of a method 1400 of generating and digitally compensating stochastic data to compensate for non-linearity of a corresponding stochastic system.

At 1402, a phase difference between first and second clocks is stochastically sampled at periodic events to provide a corresponding set of stochastic samples for each event.

At 1404, each set of samples is digitally encoded as an uncompensated first digital value.

At 1406, the first digital values are digitally compensated for non-linearity of a corresponding stochastic sampling system to provide corresponding compensated first digital values.

The stochastic sampling at 1402, the digitally encoding at 1404, and/or the digitally compensating at 1406, may be performed in accordance with one or more examples herein.

Method 1300 and/or method 1400 may include one or more features described in examples below.

EXAMPLES

The following examples pertain to further embodiments.

Example 1 is a method of determining digital compensation parameters to compensate for non-linearity of a stochastic sampling system, including estimating non-linearity of the stochastic sampling system based on statistical analysis of calibration data generated by the stochastic sampling system in response to a ramped linear input, and determining the digital compensation parameters based on the estimated non-linearity.

In an Example 2, the estimating of Example 1 includes estimating non-linearity based on a histogram of the calibration data.

In an Example 3, the estimating of Example 1 or Example 2 includes estimating a probability distribution of the calibration data, and the determining includes determining compensation parameters to uniformly distribute the probability distribution.

In an Example 4, the estimating of any preceding Example includes estimating a cumulative distribution of the calibration data from a histogram of the calibration data, and estimating the non-linearity based on the cumulative distribution, and the determining includes modelling the non-linearity as a distortion block, and the determining the digital compensation parameters based on the model.

In an Example 5, the stochastic sampling system of any preceding Example includes n stochastic samplers, the method further includes:

maintaining a non-zero and constant phase difference between first and second clocks;

sampling the first clock at transitions of the second clock to provide a sample set of n stochastic samples for each transition;

retaining sequences of the samples sets that correspond to a progression from a first saturation state in which all n samples of a sample set are at a first logic state, to a second saturation state in in which all n samples of a sample set are at a second logic state;

encoding each retained sample set as an uncompensated digital value based on states of the corresponding n samples;

estimating the non-linearity based on a first set of the uncompensated digital values as the calibration data; and digitally compensating a second set of the uncompensated digital values based on the digital compensation parameters to provide compensated digital values.

In an Example 6, the method of Example 5 further includes, controlling the first clock based on compensated digital values in a first mode, controlling the first clock based on uncompensated digital values in a second mode, and estimating the non-linearity based on the uncompensated digital values of the second mode.

In an Example 7, the method of any preceding Example further includes performing the stochastically sampling and the determining digital compensation parameters within a same integrated circuit device.

In an Example 8, at least one machine readable medium includes a plurality of instructions that in response to being executed on a computing device, cause the computing device to carry out a method according to any Examples 1-7.

In an example 9, communications device is arranged to perform the method of any one of Examples 1-7.

In an Example 10, an apparatus to compute a device location is configured to perform the method of any one of the Examples 1-7.

An Example 11 is a computer system to perform the method of any one of Examples 1-7.

An Example 12 is a machine to perform the method of any one of Examples 1-7.

In an Example 13, an apparatus includes means for performing the method of any one of one of Examples 1-7.

An Example 14 is a computing device that includes a chipset according to any one of Examples 1-7 and memory to determine the digital compensation parameters.

An Example 15 is an apparatus that includes a calibration system to determine digital compensation parameters to compensate for non-linearity of a stochastic sampling system, where the calibration system is configured to estimate non-linearity of the stochastic sampling system based on statistical analysis of calibration data generated by the stochastic sampling system when ramped linear input is applied to the stochastic sampling system, and where the calibration system is further configured to determine the digital compensation parameters based on the estimated non-linearity.

In an Example 16, the calibration module of Example 15 is further configured to estimate the non-linearity based on a histogram of the calibration data.

In an Example 17, the calibration module of Example 15 or Example 16 is further configured to estimate a probability distribution of the calibration data, and determine the digital compensation parameters to uniformly distribute the probability distribution.

In an Example 18, the calibration module of any one of Examples 15-17 is further configured to estimate a cumulative distribution of the calibration data from a histogram of the calibration data, estimate the non-linearity based on the cumulative distribution, model the non-linearity as a distortion block, and determine the digital compensation parameters based on the model.

In an Example 19, the apparatus of any one of Examples 15-18 further includes a time-to-digital converter, where the time-to-digital converter includes:
 a frequency generator to maintain a non-zero and constant phase difference between first and second clocks;
 the stochastic sampling system, including n stochastic samplers to sample the first clock at transitions of the second clock to provide a sample set of n stochastic samples for each transition, and circuitry and memory to identify and retain sequences of the samples sets that correspond to a progression from a first saturation state in which all n samples of a sample set are at a first logic state, to a second saturation state in in which all n samples of a sample set are at a second logic state;
 a digital encoder to encode each retained sample set as an uncompensated digital value based on states of the corresponding n samples;
 wherein the calibration module is configured to estimate non-linearity based on a first set of the uncompensated digital values as the calibration data; and
 a digital compensation module to digitally compensate a second set of the uncompensated digital values based on the compensation parameters to provide compensated digital values.

In an Example 20, the apparatus of Example 19 further includes a phase lock loop control system to control the first clock based on digital words provided by the time-to-digital converter; the time-to-digital converter further includes a word constructor to construct the digital words, a controllable bypass to provide compensated digital values to the word constructor in a first mode, and to uncompensated digital values in a second mode; and the calibration module is configured to estimate the non-linearity based on the uncompensated digital values of the second mode.

In an Example 21, the calibration module and the stochastic sampling system of any one of Examples 15-20 are on a same integrated circuit device.

An Example 22 is a system that includes a processor and memory; a phase locked loop (PLL) to provide a first clock to one or more of the processor and memory, wherein the PLL includes a stochastic time-to-digital converter (sTDC); a calibration system to estimate non-linearity of a stochastic sampling system of the sTDC based on statistical analysis of calibration data generated by the sTDC in response to a ramped linear input, and determine digital compensation parameters based on the estimated non-linearity; and a compensation system to compensate digital values output from the sTDC based on the digital compensation parameters to provide corresponding compensated digital values.

In an Example 23, the system of Example 22 further includes a user interface and a communication system to interface with a communication network and one or more of the processor and the user interface.

In an Example 24, the calibration system of Example 22 or Example 23 is configured to estimate non-linearity based on a histogram of the calibration data.

In an Example 25, the calibration system of any one of Examples 22-24 is configured to estimate a probability distribution of the calibration data, and determine digital compensation parameters to uniformly distribute the probability distribution.

In an Example 26, the calibration system of any one of Examples 22-25 is configured to estimate a cumulative distribution of the calibration data from a histogram of the calibration data, estimate the non-linearity based on the cumulative distribution, model the non-linearity as a distortion block, and determine the compensation parameters based on the model.

In an Example 27, the sTDC of any one of Examples 22-26 includes a controllable bypass to output compensated digital values in a first mode and uncompensated digital values to the word constructor in a second mode.

An Example 28 is a non-transitory computer-readable medium encoded with a computer program, including instructions to cause a processor to estimate non-linearity of a stochastic sampling system based on statistical analysis of calibration data generated by the stochastic sampling system in response to a ramped linear input, and determine digital compensation parameters to compensate for the estimated non-linearity.

In an Example 29, the computer readable medium of Example 28 further includes instructions to cause the processor to estimate non-linearity based on a histogram of the calibration data.

In an Example 29, the computer readable medium of Example 28 or Example 29 further includes instructions to cause the processor to estimate a probability distribution of the calibration data, and determine compensation parameters to uniformly distribute the probability distribution.

In an Example 29, the computer readable medium of any one of Examples 28-30 further includes instructions to cause the processor to estimate a cumulative distribution of the calibration data from a histogram of the calibration data, estimate non-linearity based on the cumulative distribution, model the non-linearity as a distortion block, and determine the compensation parameters based on the model.

Methods and systems are disclosed herein with the aid of functional building blocks illustrating functions, features, and relationships thereof. At least some of the boundaries of these functional building blocks have been arbitrarily defined herein for the convenience of the description. Alternate boundaries may be defined so long as the specified functions and relationships thereof are appropriately performed. While various embodiments are disclosed herein, it should be understood that they are presented as examples. The scope of the claims should not be limited by any of the example embodiments disclosed herein.

What is claimed is:

1. A method, comprising:
   estimating non-linearity of a stochastic sampler based on statistical analysis of calibration data generated by the stochastic sampler;
   determining digital compensation parameters based on the estimated non-linearity of the stochastic sampler; and
   applying the digital compensation parameters to a digital output of the stochastic sampler;
   wherein the stochastic sampler includes multiple samplers, each configured to sample a first input of the stochastic sampler based on a second input of the stochastic sampler.

2. The method of claim 1, wherein:
   a time at which one or more of the samplers registers a change in a logic state of the first input differs from a time at which one or more other ones of the samplers registers the change in the logic state of the first input, due to random variations amongst the samplers; and
   the non-linearity is due at least in part to the random variations amongst the samplers.

3. The method of claim 2, wherein the calibration data includes output states of the samplers within a window of time that includes the change in the logic state of the first input, and within which the output states of the samplers register the change.

4. The method of claim 1, wherein:
   the estimating includes estimating a cumulative distribution of the calibration data from a histogram of the calibration data, and estimating the non-linearity based on the cumulative distribution; and
   the determining includes modelling the non-linearity as a distortion block, and determining the digital compensation parameters to compensate for the distortion block.

5. The method of claim 1, wherein the stochastic sampler includes n samplers, the method further including:
   providing first and second clocks to the respective first and second inputs of the stochastic sampler to provide a sample set of n samples for each transition of the second clock;
   retaining first and second sequences of the sample sets, wherein each sequence of sample sets corresponds to a respective window of time within which the first clock transitions between logic states, and wherein each sequence of sample sets progresses from a first saturation state in which all n samples of a sample set are at a first logic state, to a second saturation state in which all n samples of a sample set are at a second logic state; and
   encoding each sample set of the first and second sequences of sample sets as an uncompensated digital word based on digital values of the respective n samples;
   wherein the estimating includes estimating the non-linearity based on a the uncompensated digital words of the first sequence of sample sets as the calibration data; and
   wherein the applying the digital compensation parameters includes digitally compensating the uncompensated digital words of the second sequence of sample sets based on the digital compensation parameters.

6. The method of claim 5, further including:
   maintaining a constant frequency difference between the first and second clocks to generate the calibration data.

7. The method of claim 1, wherein the stochastic sampler includes a stochastic time-to-digital converter (sTDC) to measure and digitally encode an instantaneous phase of a phase lock loop (PLL) clock relative to a reference clock.

8. An apparatus, comprising an integrated circuit that includes:
   a stochastic sampler that includes multiple samplers, each configured to sample a first input of the stochastic sampler based on a second input of the stochastic sampler; and
   a calibration circuit to estimate non-linearity of the stochastic sampler based on statistical analysis of calibration data generated by the stochastic sampler, determine digital compensation parameters based on the estimated non-linearity of the stochastic sampler, and apply the digital compensation parameters to a digital output of the stochastic sampler.

9. The apparatus of claim 8, wherein:
   a time at which one or more of the samplers registers a change in a logic state of the first input differs from a time at which one or more other ones of the samplers registers the change in the logic state of the first input, due to random variations amongst the samplers; and
   the non-linearity is due at least in part to the random variations amongst the samplers.

10. The apparatus of claim 9, wherein the calibration data includes output states of the samplers within a window of time that includes the change in the logic state of the first input, and within which the output states of the samplers register the change.

11. The apparatus of claim 8, wherein the calibration circuit is configured to:
    estimate a cumulative distribution of the calibration data from a histogram of the calibration data;
    estimate the non-linearity based on the cumulative distribution;
    model the non-linearity as a distortion block; and
    determine the digital compensation parameters to compensation for the distortion block.

12. The apparatus of claim 8, wherein the stochastic sampler is configured to:
    sample a first clock based on a second clock to provide a sample set of n samples for each transition of the second clock;
    retain first and second sequences of the samples sets, wherein each of the first and second sequences of sample sets corresponds to a respective window of time within which the first clock transitions between logic states, and wherein each sequence of sample sets progresses from a first saturation state in which all n samples of a sample set are at a first logic state, to a second saturation state in which all n samples of a sample set are at a second logic state; and digitally encode each retained sample set of the first and second sequences of sample sets as an uncompensated digital word based on digital values of the respective n samples;

wherein the calibration logic is configured to estimate the non-linearity based on the uncompensated digital words of the first sequence of sample sets as the calibration data, and digitally compensate the uncompensated digital words of the second sequence of sample sets based on the digital compensation parameters.

13. The apparatus of claim 12, wherein the calibration circuit is further configured to maintain a constant frequency difference between the first and second clocks to generate the calibration data.

14. The apparatus of claim 8, wherein the stochastic sampler includes a stochastic time-to-digital converter (sTDC) to measure and digitally encode an instantaneous phase of a phase lock loop (PLL) clock relative to a reference clock.

15. A system, comprising:
a processor and memory;
a phase locked loop (PLL) to provide a PLL clock to one or more of the processor and memory, wherein the PLL includes a stochastic time-to-digital converter (sTDC) to measure and digitally encode an instantaneous phase of the PLL clock relative to a reference clock;
a calibration system to estimate non-linearity of the sTDC based on statistical analysis of calibration data generated by the sTDC, determine digital compensation parameters based on the estimated non-linearity of the sTDC, and apply the digital compensation parameters to a digital output of the sTDC.

16. The system of claim 15, further including:
a user interface; and
a communication system to interface with a communication network and one or more of the processor and the user interface.

17. The system of claim 15, wherein:
the sTDC includes multiple samplers, each configured to sample a first input of the sTDC based on a second input of the sTDC;
a time at which one or more of the samplers registers a change in a logic state of the first input differs from a time at which one or more other ones of the samplers resisters the change in the logic state of the first input, due to random variations amongst the samplers; and
the non-linearity is due at least in part to the random variations amongst the samplers.

18. The system of claim 17, wherein the calibration data includes output states of the samplers within a window of time that includes the change in the logic state of the first input, and within which the output states of the samplers register the change.

19. The system of claim 15, wherein the calibration system is configured to:
estimate a cumulative distribution of the calibration data from a histogram of the calibration data;
estimate the non-linearity based on the cumulative distribution;
model the non-linearity as a distortion block; and
determine the compensation parameters to compensate for the distortion block.

20. The system of claim 15, wherein the sTDC is configured to:

sample a phase difference between first and second inputs of the sTDC to provide a sample set of n samples for each transition of the second input;

retain first and second sequences of the samples sets, wherein each of the first and second sequences of sample sets corresponds to a respective window of time within which the first clock transitions between logic states, and wherein each sequence of sample sets progresses from a first saturation state in which all n samples of a sample set are at a first logic state, to a second saturation state in which all n samples of a sample set are at a second logic state; and digitally encode each retained sample set of the first and second sequences of sample sets as an uncompensated digital word based on digital values of the respective n samples;

wherein the calibration system is configured to estimate the non-linearity based on the uncompensated digital words of the first sequence of sample sets as the calibration data, and digitally compensate the uncompensated digital words of the second sequence of sample sets based on the digital compensation parameters.

21. A non-transitory computer-readable medium encoded with a computer program, including instructions to cause a processor to:
estimate non-linearity of a stochastic sampler based on statistical analysis of calibration data generated by the stochastic sampler; and
determine digital compensation parameters based on the estimated non-linearity of the stochastic sampler; and
output the digital compensation parameter to a calibration system configured to apply the compensation parameters to a digital output of the stochastic sampler, wherein the stochastic sampler includes multiple samplers, each configured to sample a first input of the stochastic sampler based on a second input of the stochastic sampler.

22. The computer readable medium of claim 21, wherein:
a time at which one or more of the samplers registers a change in a logic state of the first input differs from a time at which one or more other ones of the samplers registers the change in the logic state of the first input, due to random variations amongst the samplers;
the non-linearity is due at least in part to the random variations amongst the samplers; and
the calibration data includes output states of the samplers within a window of time that includes the change in the logic state of the first in input, and within which the output states of the samplers register the change.

23. The computer readable medium of claim 22, wherein the calibration data includes output states of the samplers within a window of time that includes the change in the logic state of the first input, and within which the output states of the samplers register the change.

24. The computer readable medium of claim 21, further including instructions to cause the processor to:
estimate a cumulative distribution of the calibration data from a histogram of the calibration data;
estimate non-linearity based on the cumulative distribution;
model the non-linearity as a distortion block; and
determine the compensation parameters to compensate for the distortion block.

* * * * *